United States Patent
Fukatani et al.

(10) Patent No.: US 10,833,236 B2
(45) Date of Patent: Nov. 10, 2020

(54) P-TYPE THERMOELECTRIC CONVERSION MATERIAL, THERMOELECTRIC CONVERSION MODULE, AND METHOD OF MANUFACTURING P-TYPE THERMOELECTRIC CONVERSION MATERIAL

(71) Applicant: Hitachi Metals, Ltd., Minato-ku, Tokyo (JP)

(72) Inventors: Naoto Fukatani, Tokyo (JP); Akinori Nishide, Tokyo (JP); Yosuke Kurosaki, Tokyo (JP); Shin Yabuuchi, Tokyo (JP); Jyun Hayakawa, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 16/461,519

(22) PCT Filed: Dec. 27, 2017

(86) PCT No.: PCT/JP2017/047130
§ 371 (c)(1),
(2) Date: May 16, 2019

(87) PCT Pub. No.: WO2018/135286
PCT Pub. Date: Jul. 26, 2018

(65) Prior Publication Data
US 2019/0348594 A1 Nov. 14, 2019

(30) Foreign Application Priority Data
Jan. 20, 2017 (JP) .................................. 2017-008683

(51) Int. Cl.
*H01L 35/22* (2006.01)
*H01L 35/32* (2006.01)
(Continued)

(52) U.S. Cl.
CPC ................ *H01L 35/22* (2013.01); *B22F 9/04* (2013.01); *C22C 30/00* (2013.01); *C22C 33/02* (2013.01);
(Continued)

(58) Field of Classification Search
CPC . H01L 35/22; H01L 35/32; B22F 9/04; C22C 30/00; C22C 33/02; C22C 38/02; C22C 38/06; C22C 38/14
See application file for complete search history.

(56) References Cited

U.S. PATENT DOCUMENTS

2006/0053969 A1 3/2006 Harada et al.
2012/0160288 A1 6/2012 Hayakawa et al.
(Continued)

FOREIGN PATENT DOCUMENTS

JP 2012-138539 A 7/2012
JP 2015-122476 A 7/2015
(Continued)

OTHER PUBLICATIONS

Kumar et al., Performance Comparison of Some Common Thermocouples for Waste Heat Utilization, Asian Journal of Chemistry, vol. 21, No. 10, pp. S062-S065 (Year: 2009).*
(Continued)

*Primary Examiner* — Jayne L Mershon
(74) *Attorney, Agent, or Firm* — Crowell & Moring LLP (57) ABSTRACT

Provided are a p-type thermoelectric conversion material, a thermoelectric conversion module, and a method of manufacturing a p-type thermoelectric conversion material that are capable of obtaining high thermoelectric conversion characteristics. The p-type thermoelectric conversion material has a full Heusler alloy having a composition represented by the following General Formula (1) and has a relative density of 85% or more, $Fe_xTi_yMA_aMB_b$ ... (1),
(Continued)

wherein in Formula (1), MA is one element selected from the group consisting of Si, Sn, and Ge, MB is one element selected from the group consisting of Al, Ga, and In, and x, y, a, and b are numbers set so that x+y+a+b=100, a+b=z, $50<x\leq52.5$, $20\leq y\leq24.5$, $24.5\leq z\leq29$, $a>0$, and $b>0$ in atom %, respectively.

14 Claims, 3 Drawing Sheets

(51) Int. Cl.

| | | |
|---|---|---|
| *B22F 9/04* | (2006.01) | |
| *C22C 30/00* | (2006.01) | |
| *C22C 33/02* | (2006.01) | |
| *C22C 38/02* | (2006.01) | |
| *C22C 38/06* | (2006.01) | |
| *C22C 38/14* | (2006.01) | |

(52) U.S. Cl.
CPC ............. *C22C 38/02* (2013.01); *C22C 38/06* (2013.01); *C22C 38/14* (2013.01); *H01L 35/32* (2013.01); *B22F 2009/041* (2013.01); *B22F 2301/35* (2013.01)

(56) References Cited

U.S. PATENT DOCUMENTS

| | | |
|---|---|---|
| 2014/0345663 A1 | 11/2014 | Hayakawa et al. |
| 2015/0136195 A1 | 5/2015 | Nishide et al. |

FOREIGN PATENT DOCUMENTS

| | | |
|---|---|---|
| WO | WO 2004/049464 A1 | 6/2004 |
| WO | WO 2013/093967 A1 | 6/2013 |

OTHER PUBLICATIONS

International Search Report (PCT/ISA/210) issued in PCT Application No. PCT/JP2017/047130 dated Mar. 6, 2018 with English translation (four (4) pages).

Japanese-language Written Opinion (PCT/ISA/237) issued in PCT Application No. PCT/JP2017/047130 dated Mar. 6, 2018 (four (4) pages).

Mikami et al., "Effect of Ti Substitution on Thermoelectric Properties of W-Doped Heusler Fe2VAl Alloy", Journal of Electronic Materials, Feb. 9, 2013, pp. 1801-1806, vol. 42, No. 7 (six (6) pages).

* cited by examiner

P-TYPE THERMOELECTRIC CONVERSION MATERIAL, THERMOELECTRIC CONVERSION MODULE, AND METHOD OF MANUFACTURING P-TYPE THERMOELECTRIC CONVERSION MATERIAL

TECHNICAL FIELD

The present invention relates to a p-type thermoelectric conversion material, a thermoelectric conversion module, and a method of manufacturing a p-type thermoelectric conversion material.

BACKGROUND ART

As a technique for converting exhaust heat energy into electric power, a thermoelectric conversion module has been known, and atypical example of a thermoelectric conversion material that can be adapted for exhaust heat recovery in a temperature range of 300° C. or less can include an $Fe_2VAl$-based full Heusler alloy or a Bi—Te-based semiconductor. Among them, the $Fe_2VAl$-based full Heusler alloy has been known as a material having toxicity lower than that of the Bi—Te-based semiconductor and an environmental load smaller than that of the Bi—Te-based semiconductor.

In general, in the thermoelectric conversion module, a combination of an n-type thermoelectric conversion material and a p-type thermoelectric conversion material is used. For this reason, in order to obtain high thermoelectric conversion characteristics in the thermoelectric conversion module, it is required to obtain high figures of merit ZTs in both of the n-type thermoelectric conversion material and the p-type thermoelectric conversion material. In the present situation, since a figure of merit ZT of the p-type thermoelectric conversion material is lower than that of the n-type thermoelectric conversion material, improvement of a value of the figure of merit ZT of the p-type thermoelectric conversion material is required.

NPL 1 discloses an $Fe_2VAl$-based full Heusler alloy showing a figure of merit ZT=0.13, which is the highest value up to now, as a figure of merit ZT when a full Heusler alloy is applied as a p-type thermoelectric conversion material.

PTL 1 suggests an $Fe_2TiSi$-based full Heusler alloy as a thermoelectric conversion material that has low toxicity, can be manufactured without using a material containing a high-cost element such as V, Bi, or Te, and can obtain a high figure of merit ZT.

CITATION LIST

Patent Literature

PTL 1: JP 2015-122476 A

Non Patent Literature

NPL 1: M. Mikami, "Journal of ELECTRONIC MATERIALS", 2013, Vol. 142, No. 7, p. 1801-1806

SUMMARY OF INVENTION

Technical Problem

The $Fe_2VAl$-based full Heusler alloy disclosed in NPL 1 exhibits a figure of merit ZT higher than that of the conventional p-type full Heusler alloy, as described above, but exhibits a figure of merit ZT corresponding to only about a half of a figure of merit ZT of the n-type thermoelectric conversion material, such that sufficient thermoelectric conversion characteristics cannot necessarily be obtained.

PTL 1 describes thermoelectric conversion characteristics of an $Fe_2TiSi$-based full Heusler alloy having a composition ratio based on Fe:Ti:Si=2:1:1, as a p-type thermoelectric conversion material, but in a p-type thermoelectric conversion material, improvement of thermoelectric conversion characteristics is further required.

Therefore, an object of the invention is to provide a p-type thermoelectric conversion material, a thermoelectric conversion module, and a method of manufacturing a p-type thermoelectric conversion material that are capable of obtaining high thermoelectric conversion characteristics.

Solution to Problem

A p-type thermoelectric conversion material according to a preferred embodiment of the invention has a full Heusler alloy having a composition represented by the following General Formula (1) and has a relative density of 85% or more, wherein in Formula (1), MA is one element selected from the group consisting of Si, Sn, and Ge, MB is one element selected from the group consisting of Al, Ga, and In, and x, y, a, and b are numbers set so that x+y+a+b=100, a+b=z, 50<x≤52.5, 20≤y≤24.5, 24.5≤z≤29, a>0, and b>0 in atom %, respectively.

A thermoelectric conversion module according to a preferred embodiment of the invention includes: a plurality of thermoelectric conversion elements; and an electrode which electrically connects the thermoelectric conversion elements to each other, wherein the thermoelectric conversion elements include a p-type thermoelectric conversion element including a p-type thermoelectric conversion material having a full Heusler alloy having a composition represented by the following General Formula (1) and having a relative density of 85% or more and an n-type thermoelectric conversion element connected to the p-type thermoelectric conversion element by the electrode, in Formula (1), MA is one element selected from the group consisting of Si, Sn, and Ge, MB is one element selected from the group consisting of Al, Ga, and In, and x, y, a, and b are numbers set so that x+y+a+b=100, a+b=z, 50<x≤52.5, 20≤y≤24.5, 24.5≤z≤29, a>0, and b>0 in atom %, respectively.

A method of manufacturing a p-type thermoelectric conversion material according to a preferred embodiment of the invention includes: preparing Fe raw material powders, Ti raw material powders, MA raw material powders, and MB raw material powders in a ratio depending on a target composition; mixing the Fe raw material powders, the Ti raw material powders, the MA raw material powders, and the MB raw material powders with one another to prepare a mixture containing Fe, Ti, MA, and MB, and amorphizing the mixture to form an amorphized alloy; and heating the amorphized alloy to manufacture the p-type thermoelectric conversion material having a full Heusler alloy having a composition represented by the following General Formula (1) and having a relative density of 85% or more, wherein in Formula (1), MA is one element selected from the group consisting of Si, Sn, and Ge, MB is one element selected from the group consisting of Al, Ga, and In, and x, y, a, and b are numbers set so that x+y+a+b=100, a+b=z, 50<x≤52.5, 20≤y≤24.5, 24.5≤z≤29, a>0, and b>0 in atom %, respectively.

Advantageous Effects of Invention

According to the invention, it is possible to realize a p-type thermoelectric conversion material, a thermoelectric conversion module, and a method of manufacturing a p-type thermoelectric conversion material that are capable of obtaining high thermoelectric conversion characteristics.

DESCRIPTION OF EMBODIMENTS

A p-type thermoelectric conversion material according to Example has an Fe$_2$TiM-based full Heusler alloy. Here, a metal M refers to a metallic element or a metalloid element other than Fe and Ti. The present inventors have founded that a high thermoelectric conversion performance can be obtained in a full Heusler alloy having a composition represented by the following General Formula (1), changed from a composition ratio based on Fe:Ti:Si=2:1:1 which has been studied as a useful composition in a p-type thermoelectric conversion material in the related art, as a result of studying thermoelectric conversion characteristics of an Fe$_2$TiM-based full Heusler alloy as the p-type thermoelectric conversion material.

$Fe_xTi_yMA_aMB_b$     (1)

(In Formula (1), MA is one element selected from the group consisting of Si, Sn, and Ge, MB is one element selected from the group consisting of Al, Ga, and In, and x, y, a, and b are numbers set so that x+y+a+b=100, a+b=z, 50<x≤52.5, 20≤y≤24.5, 24.5≤z≤29, a>0, and b>0 in atom %, respectively).

A maximum output of a thermoelectric conversion module depends on a dimensionless figure of merit ZT of a thermoelectric conversion material. For this reason, performance of the thermoelectric conversion material is evaluated by a dimensionless figure of merit ZT of the following Equation (2).

[Expression 1]

$$ZT = \frac{S^2}{\rho \kappa} T \quad (2)$$

In the following description, a "dimensionless figure of merit ZT" is simply referred to as a figure of merit ZT. In Equation (2), S is a Seebeck coefficient, $\rho$ is an electrical resistivity, $\kappa$ is a thermal conductivity, and T is a temperature. Therefore, in order to improve the maximum output P of the thermoelectric conversion module, it is preferable to increase the Seebeck coefficient S of the thermoelectric conversion material, decrease the electrical resistivity $\rho$ of the thermoelectric conversion material, and decrease the thermal conductivity $\kappa$ of the thermoelectric conversion material.

In the above General Formula (1), Fe is in a range larger than 2 and Ti is in a range smaller than 1 as compared with the conventional composition ratio of Fe:Ti:Si=2:1:1. As a result, it is possible to control an electronic state of the thermoelectric conversion material to a state appropriate as a p-type thermoelectric conversion material.

In addition, in the above General Formula (1), by constituting M in the Fe$_2$TiM-based full Heusler alloy by MA having a valence electron number of 4 and MB having a valence electron number of 3, a valence electron number of the entire thermoelectric conversion material is decreased as compared with a case of constituting M by only MA, such that the thermoelectric conversion material is in a state where holes that become carriers are doped. As a result, it is possible to obtain a high figure of merit ZT as the p-type thermoelectric conversion material. In the above General Formula (1), in a case where M is constituted by only MA, the thermoelectric conversion material is in an electronic state similar to Fe$_2$TiM having an electronic state close to an intrinsic semiconductor. For this reason, a carrier density is decreased and an electrical resistivity is increased, such that it is difficult to obtain a high figure of merit ZT.

In the above General Formula (1), it is preferable that MA is Si and it is preferable that MB is Al, in terms of ease of manufacture and cost reduction. In this case, the General Formula (1) is represented by the following Formula (3).

$Fe_xTi_ySi_aAl_b$     (3)

In the range where an Fe amount x is more than 50 atom % and 52.5 atom % or less, the Seebeck coefficient is increased and the figure of merit ZT is improved, due to a change in an electronic structure according to an increase in the Fe amount. If the Fe amount x is x≤50 or x>52.5, it is easy for a Seebeck coefficient of the p-type thermoelectric conversion material to be decreased.

In the range where a Ti amount y is 20≤y≤24.5, the electrical resistivity is decreased and the figure of merit ZT is improved, due to improvement of crystallinity. When the Ti amount y is y<20 or y>24.5, the crystallinity of the full Heusler alloy is decreased, such that it is easy for the figure of merit ZT to be decreased.

The crystallinity of the full Heusler alloy can be evaluated by, for example, a crystallization calorific value. Here, the crystallization calorific value refers to a calorific value at the time of temperature rise when being measured by a differential scanning calorimeter, and the higher the crystallization calorific value, the higher the crystallinity of the alloy.

In addition, when an M amount z is z<24.5, it is easy for the figure of merit ZT as the p-type thermoelectric conversion material for to be decreased due to a decrease in the crystallinity of the full Heusler alloy. In addition, when z>29, it is easy for the Seebeck coefficient to be decreased.

The Fe amount x, the Ti amount y, and the M amount z are, preferably, 50.75≤x≤52, 20.5≤y≤24.25, 24.75≤z≤28.5, more preferably, 51≤x≤51.5, 21≤y≤24, and 25≤z≤28.

An MB amount b is preferably 2.5≤b≤9. By adding MB in the range of 2.5≤b≤9, it is possible to increase the number of holes that become carriers and adjust a carrier concentration to the optimal concentration for the p-type thermoelectric conversion material, such that it is possible to obtain a high figure of merit ZT as the p-type thermoelectric conversion material. When the MB amount b is b<2.5, the number of carriers of holes included in the thermoelectric conversion material is decreased, such that there is a risk that the electrical resistivity will be increased. In addition, when the MB amount b is b>9, the number of carriers of the holes becomes excessive, such that there is a risk that the Seebeck coefficient will be decreased. A preferable MB amount b is 3≤b≤8.5. A more preferable MB amount b is 3.5≤b≤8.

In terms of adjusting the number of carriers of the holes to an appropriate amount so as to improve thermoelectric conversion performance, it is preferable that an MA amount a, which is an element having one more valence electron number than that of MB, is 16.5≤a≤23. The MA amount a is more preferably 17≤a≤22.5, more preferably 17.5≤a≤22.

In the above General Formula (1) and General Formula (2), it is preferable that x, y, z, and b are 50<x≤52.5, 20≤y≤24.5, 24.5≤z≤29, and 2.5≤b≤9. In this case, ZT>0.13 can be obtained. In the above range, it is preferable that the MA amount a is 16.5≤a≤23.

In addition, in the above General Formula (1) and General Formula (2), it is preferable that x, y, z, and b are 50.75≤x≤52, 20.5≤y≤24.25, 24.75≤z≤28.5, and 3≤b≤8.5. In this case, ZT>0.15 can be obtained. In the above range, it is preferable that the MA amount a is 17≤a≤22.5.

In addition, in the above General Formula (1) and General Formula (2), it is preferable that x, y, z, and b are 51≤x≤51.5, 21≤y≤24, 25≤z≤28, and 3.5≤b≤8. In this case, ZT>0.17 can be obtained. In the above range, it is preferable that the MA amount a is 17.5≤a≤22.

The p-type thermoelectric conversion material has a relative density of 85% or more. By setting the relative density to 85% or more, a current path between alloy powders is secured and the electrical resistivity is decreased. In addition, by setting the relative density to 85% or more, it is possible to obtain mechanical strength required for securing reliability of the thermoelectric conversion module. When the relative density is less than 85%, the electrical resistivity is increased, such that it is easy for the figure of merit ZT to be decreased. In addition, when the relative density is less than 85%, the mechanical strength is decreased, such that it is easy for the thermoelectric conversion material to be damaged. The relative density is changed depending on an alloy composition, an alloy powder condition, a heat treatment condition at the time of sintering alloy powders, and the like. Therefore, for example, by adjusting a heat treatment temperature, a pressure, a holding time of the heat treatment temperature, and the like, it is possible to set the relative density to 85% or more.

The full Heusler alloy having the composition represented by the above General Formula (1) has an $L2_1$-type crystal structure, such that it can obtain excellent thermoelectric conversion characteristics as the p-type thermoelectric conversion material, which is preferable.

When a crystallization calorific value of the p-type thermoelectric conversion material is 160 J/g or more, crystallinity of the p-type thermoelectric conversion material is improved, such that an electronic state contributing to improvement of the Seebeck coefficient becomes steep and the figure of merit ZT is improved. Therefore, a figure of merit ZT of 0.13 or more, which is a maximum value indicated by the conventional $Fe_2VAl$-based full Heusler alloy, can be obtained, which is preferable.

According to the p-type thermoelectric conversion material according to Example described above, it is possible to obtain the figure of merit ZT of 0.13 or more, which is the maximum value indicated by the conventional $Fe_2VAl$-based full Heusler alloy, as the figure of merit ZT when the p-type thermoelectric conversion material according to Example is applied as the p-type thermoelectric conversion material. In addition, since the p-type thermoelectric conversion material according to Example does not contain high-cost elements such as V, Bi, and Te or elements having a high toxicity, it is possible to obtain the p-type thermoelectric conversion material having a figure of merit ZT equal to or higher than that of the conventional full Heusler alloy can be obtained at a low cost and a low environmental load.

It should be noted that the p-type thermoelectric conversion material according to Example can be easily confirmed by composition analysis.

Next, a method of manufacturing the p-type thermoelectric conversion material according to Example will be described.

First, Fe raw material powders, Ti raw material powders, MA raw material powders, and MB raw material powders are prepared in a ratio depending on a target composition. Specifically, the Fe raw material powders, the Ti raw material powders, the MA raw material powders, and the MB raw material powders are prepared so that a finally obtained sintered material satisfies a composition range represented by the above General Formula (1).

Then, the respective raw material powders described above are mixed with one another to prepare a mixture containing Fe, Ti, MA, and MB, and the obtained mixture is amorphized by, for example, a mechanical alloying method to obtain an amorphized alloy. It should be noted that it is also possible to use roll super quenching, atomizing, or the like as another method of amorphizing the mixture ($Fe_2TiM$-based alloy) of the raw material powders. In addition, in a case where the amorphized alloy is not obtained as a powdery substance, for example, a method of performing hydrogen embrittlement on the amorphized alloy and pulverizing the amorphized alloy in an environment in which oxidation is prevented may be used. Then, the amorphized alloy is molded by a method such as press molding. A pressure at the time of molding the amorphized alloy can be, for example, 40 MPa to 5 GPa.

Then, the amorphized alloy is heated at a temperature of 450° C. or more and 800° C. or less to be sintered. Therefore, a full Heusler alloy having an $L2_1$-type crystal structure is obtained. As described above, the raw material powders are amorphized and are then heat-treated at a temperature of 450° C. or more and 800° C. or less, such that the full Heusler alloy having the $L2_1$-type crystal structure can be obtained. The reason is that the $Fe_2TiM$-based $L2_1$-type crystal structure is a metastable structure, and it is thus possible to prepare the $L2_1$-type crystal structure as an intermediate product through an amorphous structure in a high energy state.

When the heating temperature is lower than 450° C., the $L2_1$-type crystal structure cannot be obtained. On the other hand, when the heating temperature exceeds 800° C., the $L2_1$-type crystal structure may be thermally decomposed to form another stable alloy. In this case, it becomes difficult to use an obtained sintered body as the thermoelectric conversion material.

A holding time of the heating temperature described above is not particularly limited, but it can be set to approximately 3 to 600 minutes. A spark plasma sintering method or a hot press method capable of simultaneously performing press molding and heating can be used as the heat treatment.

The p-type thermoelectric conversion material can have the relative density of 85% or more by adjusting a property of the amorphized alloy powdery substance, the pressure at the time of performing press molding, the heat treatment temperature, the holding time of the heat treatment temperature, or the like described above.

Specifically, as a condition at the time of sintering the alloy powders, the heat treatment temperature is set to 500° C. or more and 800° C. or less, the pressure at the time of the heat treatment is set to 0.5 GPa or more and 10 GPa or less, and the holding time of the heat treatment temperature is set to 30 seconds or more, such that it is possible to obtain the thermoelectric conversion material having the relative density of 85% or more. The heat treatment temperature is, more preferably, 550° C. or more and 800° C. or less, still more preferably, 600° C. or more and 700° C. or less.

<Thermoelectric Conversion Module>

Figure 1:
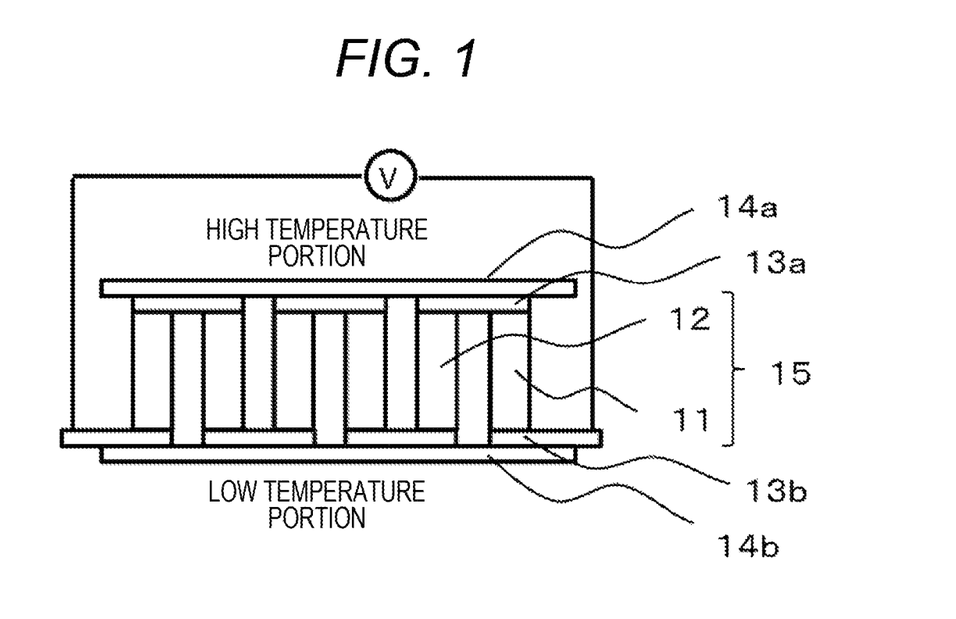
FIG. 1 is a cross-sectional view illustrating a configuration of a thermoelectric conversion module according to Example.

Next, a thermoelectric conversion module using the p-type thermoelectric conversion material according to Example will be described. FIG. 1 is a cross-sectional view illustrating a configuration of a thermoelectric conversion module according to Example. In the thermoelectric conversion module illustrated in FIG. 1, p-type thermoelectric conversion elements 11 and n-type thermoelectric conversion elements 12 are provided between an upper substrate 14a and a lower substrate 14b. The p-type thermoelectric conversion element 11 is formed to include a p-type thermoelectric conversion material, and the n-type thermoelectric conversion element 12 is formed to include an n-type thermoelectric conversion material. One or more p-type thermoelectric conversion elements 11 are formed by the p-type thermoelectric conversion material according to Example described above.

The p-type thermoelectric conversion elements 11 and the n-type thermoelectric conversion elements 12 are alternately arranged between the upper substrate 14a and the lower substrate 14b, and are electrically connected to each other in series by upper electrodes 13a formed on the upper substrate 14a and lower electrodes 13b formed on the lower substrate 14b with one set of thermoelectric conversion element pairs 15 having a π-shaped structure.

Specifically, the p-type thermoelectric conversion element 11 is connected to the n-type thermoelectric conversion element 12 on a surface thereof facing the upper substrate 14a by the upper electrode 13a. In addition, the p-type thermoelectric conversion element 11 is connected to the n-type thermoelectric conversion element 12 provided on a side opposite to the n-type thermoelectric conversion element 12 connected thereto by the upper electrode 13a, by the lower electrode 13b on a surface thereof facing the lower substrate 14b. It should be noted that the p-type thermoelectric conversion elements 11 and the n-type thermoelectric conversion elements 12 are alternately arranged with a predetermined interval interposed therebetween, such that the p-type thermoelectric conversion elements 11 and the n-type thermoelectric conversion elements 12 are not in direct contact with each other.

The upper electrode 13a, and the p-type thermoelectric conversion element 11 and the n-type thermoelectric conversion element 12 are connected to each other by conductive materials, and the lower electrode 13b, and the p-type thermoelectric conversion element 11 and the n-type thermoelectric conversion element 12 are connected to each other by conductive materials. Stress relieving structures may be provided for these structures, or other accessories may be attached to these structures.

Due to the structure described above, the p-type thermoelectric conversion elements 11 and the n-type thermoelectric conversion elements 12, and the upper electrodes 13a and the lower electrodes 13b are bonded to each other so as to be in thermal contact with each other, and the upper electrodes 13a and the lower electrodes 13b, and the upper substrate 14a and the lower substrate 14b are bonded to each other so as to be in thermal contact with each other.

In the thermoelectric conversion module illustrated in FIG. 1, it is possible to generate temperature gradients in the same direction in the p-type thermoelectric conversion elements 11 and the n-type thermoelectric conversion elements 12, for example, by heating the upper substrate 14a or bringing the upper substrate 14a into contact with a high temperature portion. In this case, thermo-electromotive forces are generated in directions opposite to each other depending on the temperature gradients in the p-type thermoelectric conversion elements 11 and the n-type thermoelectric conversion elements 12, respectively, according to a principle of a Seebeck effect. As a result, a large thermo-electromotive force can be generated.

Therefore, it is possible to efficiently take out electric energy by connecting both ends of the electrodes (for example, a lower electrode 13b of a right end in FIG. 1 and a lower electrode 13b of a left end in FIG. 1) to each other in a state where the temperature gradients are applied.

As the n-type thermoelectric conversion material of the n-type thermoelectric conversion element 12, an $Fe_2TiSi$-based full Heusler alloy may be used, an $Fe_2VAl$-based full Heusler alloy may be used, or a Bi—Te-based semiconductor may be used. Among them, in a case where the $Fe_2TiSi$-based full Heusler alloy is used as the n-type thermoelectric conversion material, a temperature range in which a high mechanical property and a high figure of merit ZT can be obtained is substantially the same as a temperature range in which a high mechanical property and a high figure of merit ZT can be obtained in the p-type thermoelectric conversion material according to Example described above. For this reason, in terms of improving output characteristics or reliability of the thermoelectric conversion module and reducing a cost of the thermoelectric conversion module, it is preferable to use the $Fe_2TiSi$-based full Heusler alloy as the n-type thermoelectric conversion element.

Experimental Example 1

Hereinafter, the p-type thermoelectric conversion material according to Example will be described in detail by Experimental Example 1. First, a full Heusler alloy having an $L2_1$-type crystal structure represented by $E1_2E2E3$ was manufactured as the p-type thermoelectric conversion material according to Example by the following method.

Raw material powders containing iron (Fe), titanium (Ti), and silicon (Si) as main components were used, respectively, as raw material powders constituting main components of each of an E1 site, an E2 site, and an E3 site. In addition, raw material powders containing aluminum (Al) as a main component were used as raw material powders of a component added to the E3 site. These raw material powders were weighed so that the finally obtained thermoelectric conversion material has a composition of Table 1.

Then, these raw material powders were put in a container formed of stainless steel in an inert gas atmosphere, and are mixed with balls formed of stainless steel or balls formed of chrome steel, having a diameter of 10 mm. Then, mechanical alloying using a planetary ball mill apparatus is performed on this mixture to obtain amorphized alloy powders. The mechanical alloying was performed for 20 hours or more at a revolution speed of 350 rpm.

Then, the amorphized alloy powders were put in a die formed of carbon or a die formed of tungsten carbide, and were heated in an inert gas atmosphere while applying a pulse current under a pressure of 1.5 GPa, to be sintered. Heat treatment was performed by raising a temperature up to 660° C. and then holding the temperature at a target temperature (660° C.) for 30 minutes. Then, an obtained sintered body was cooled up to room temperature to obtain thermoelectric conversion materials (Sample 1 to Sample 11). A diameter, a height, and a weight of each of Sample 1 to Sample 11 that are obtained were measured, and the weight was divided by a volume to obtain a relative density. As a result, in all of Sample 1 to Sample 11, the relative density was 85% or more.

[Evaluation Method]

Then, a Seebeck coefficient and an electrical conductivity of each thermoelectric conversion material obtained were measured by a thermoelectric property evaluation apparatus ("ZEM-2", manufactured by ADVANCE RIKO, Inc.), a thermal conductivity of each thermoelectric conversion material obtained was measured by a laser flash method thermal constant measurement apparatus ("LFA 447 Nanoflush", manufactured by Netzsch Japan K.K.), and a figure of merit ZT of each sample was calculated. In addition, measurement was performed by a differential scanning calorimeter ("Thermo Plus DSC8270", manufactured by Rigaku Corporation) to calculate a crystallization calorific value of each sample. The measurement using the differential scanning calorimeter was performed under a condition in which a temperature rise speed was 10° C./min in an Ar flow atmosphere, and a measurement temperature range was from room temperature to 900° C. The crystallization calorific value was calculated in a unit of J/g by dividing an integrated value of an exothermic peak depending on crystallization of the full Heusler alloy by a weight of a sample.

Figure 2:
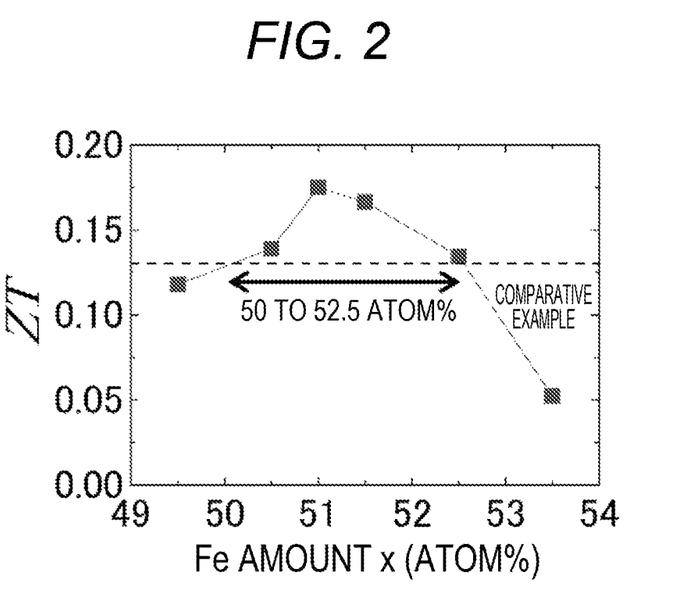
FIG. 2 is a view illustrating a relationship between an Fe amount x and a figure of merit ZT in a p-type thermoelectric conversion material according to Example.
Figure 3:
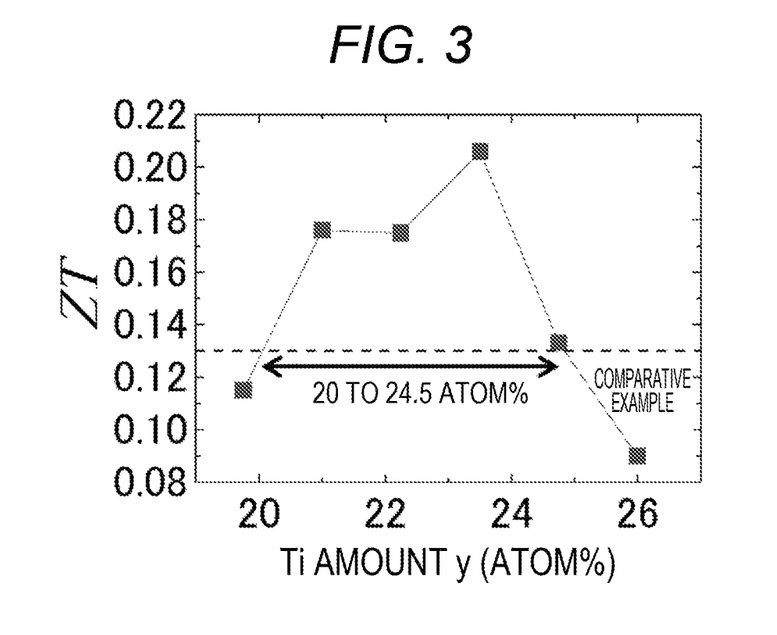
FIG. 3 is a view illustrating a relationship between a Ti amount y and a figure of merit ZT in the p-type thermoelectric conversion material according to Example.
Figure 4:
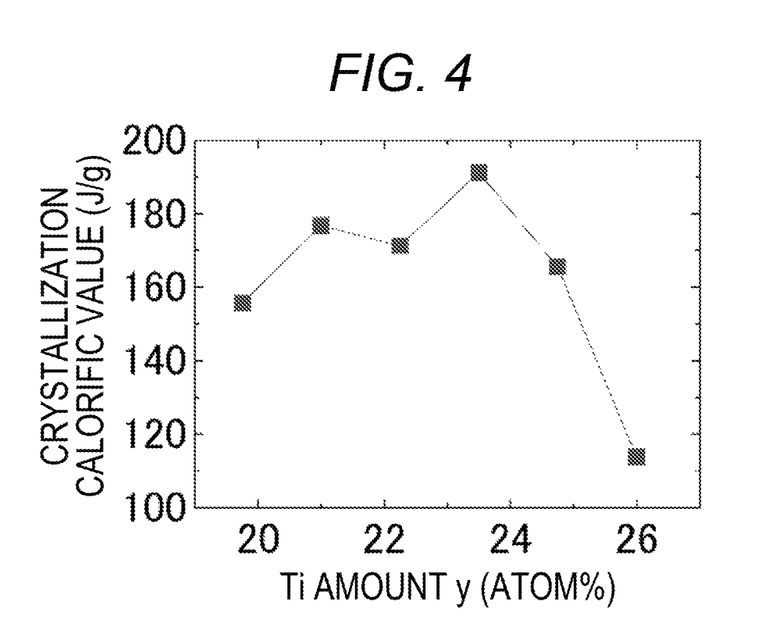
FIG. 4 is a view illustrating a relationship between a Ti amount y and a crystallization calorific value in the p-type thermoelectric conversion material according to Example.

Evaluation results of samples are illustrated in FIGS. 2 to 4. In FIGS. 2 to 3, 0.13, which is a maximum value of a figure of merit ZT of the conventional p-type full Heusler alloy, is indicated by a broken line in the drawings as a boundary between Example and Comparative Example.

[Evaluation Result]

In FIG. 2, figures of merit ZT when an M amount (Si amount+Al amount) was fixed at 26.76 atom %, an Fe amount was increased from 49.5 atom % to 53.5 atom %, and a Ti amount was decreased by an increase amount of Fe are illustrated (Sample 1 to Sample 6). In FIG. 2, a Si amount was 23.01 atom % and an Al amount was 3.75 atom %.

As illustrated in FIG. 2, in a composition region in which the Fe amount is more than 50 atom % and 52.5 atom % or less, a figure of merit ZT exceeding 0.13, which is the maximum figure of merit ZT of the conventional p-type full Heusler alloy, can be obtained. A main factor of such an improvement of the figure of merit ZT in the range where the Fe amount is more than 50 atom % is that a Seebeck coefficient has been increased due to a change in an electronic structure depending on the increase in the Fe amount. As illustrated in FIG. 2, ZT>0.15 is obtained in the range of $50.75 \leq x \leq 52$, and ZT>0.17 is obtained in the range of $51 \leq x \leq 51.5$.

In FIG. 3, figures of merit ZT when an Fe amount was fixed at 51 atom %, which shows the maximum figure of merit ZT in FIG. 2, a Ti amount was increased from 19.75 atom % to 26 atom %, and a Si amount was decreased by an increase amount of Ti are illustrated (Sample 3, and Sample 7 to Sample 11). In FIG. 3, an Al amount added to the E3 site was fixed at 3.75 atom %.

As illustrated in FIG. 3, in a composition region in which the Ti amount is $20 \leq y \leq 24.5$, a figure of merit ZT exceeding 0.13, which is the maximum figure of merit ZT of the conventional p-type full Heusler alloy, can be obtained. In addition, ZT>0.15 is obtained in the range of $20.5 \leq y \leq 24.25$, and ZT>0.17 is obtained in the range of $21 \leq y \leq 24$. A main factor of such an improvement of the figure of merit ZT depending on the increase in the Ti amount is that an electrical resistivity has been decreased due to improvement of crystallinity. The crystallinity of the thermoelectric conversion material can be evaluated by a magnitude of the crystallization calorific value of the Heusler alloy obtained by using a differential scanning calorimeter.

FIG. 4 illustrates evaluation results of crystallization calorific values for Sample 3 and Sample 7 to Sample 11 of which the figures of merit ZT were evaluated in FIG. 3. As illustrated in FIG. 4, the largest crystallization calorific value is obtained in Sample 9 (Ti amount: 23.5%) showing the maximum figure of merit ZT in FIG. 3 among Sample 3 and Samples 7 to 11.

Experimental Example 2

Next, Experimental Example 2 will be described. In Experimental Example 2, the same raw material powders as those used in Experimental Example 1 were weighed so that the finally obtained thermoelectric conversion material has a composition of Table 2, and thermoelectric conversion materials were obtained (Sample 12 to Sample 22) using the same manufacturing process as that of Experimental Example 1. A diameter, a height, and a weight of each of Sample 12 to Sample 22 that are obtained were measured, and the weight was divided by a volume to obtain a relative density. As a result, in all of Sample 12 to Sample 22, the relative density was 85% or more.

In Sample 12 to Sample 22 of Table 2, $Fe_{51}Ti_{23.5}Si_{25.5}Al_b$ was used as a base composition, an Al amount was increased, and a Si amount was decreased by an increase amount of Al. Figures of merit ZT of the obtained thermoelectric conversion materials were evaluated in the same manner and under the same conditions as those of Experimental Example 1. Evaluation results are illustrated in FIG. 5.

[Evaluation Result]

Figure 5:
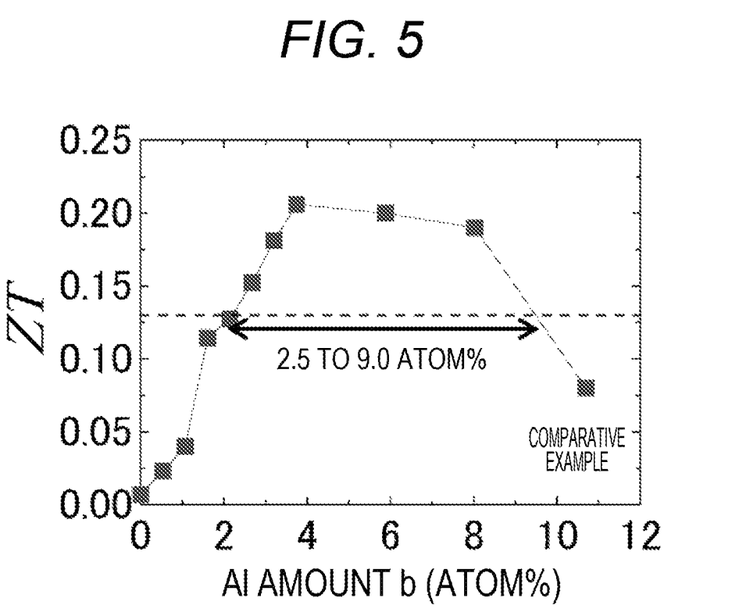
FIG. 5 is a view illustrating a relationship between an Al amount b and a figure of merit ZT in the p-type thermoelectric conversion material according to Example.

As illustrated in FIG. 5, in a composition region in which the Al amount is $2.5 \leq b \leq 9$, a figure of merit ZT exceeding 0.13, which is the maximum figure of merit ZT of the conventional p-type full Heusler alloy, can be obtained. Al is added to increase the number of holes that become carriers, such that it is possible to adjust a carrier concentration to the optimal concentration for the p-type thermoelectric conversion material, and it is possible to obtain a high figure of merit ZT as the p-type thermoelectric conversion material. As illustrated in FIG. 5, ZT>0.15 is obtained in the range of $3 \leq b \leq 8.5$, and ZT>0.17 is obtained in the range of $3.5 \leq b \leq 8$.

TABLE 1

| Sample No. | Composition (Atom %) | | | | ZT | Relative Density (%) |
|---|---|---|---|---|---|---|
| | Fe | Ti | Si | Al | | |
| 1 | 49.50 | 23.75 | 23.01 | 3.75 | 0.12 | 87.3 |
| 2 | 50.50 | 22.75 | 23.01 | 3.75 | 0.14 | 90.1 |
| 3 | 51.00 | 22.25 | 23.01 | 3.75 | 0.18 | 91.1 |
| 4 | 51.50 | 21.75 | 23.01 | 3.75 | 0.17 | 90.7 |
| 5 | 52.50 | 20.75 | 23.01 | 3.75 | 0.13 | 89.3 |
| 6 | 53.50 | 19.75 | 23.01 | 3.75 | 0.05 | 92.8 |
| 7 | 51.00 | 19.75 | 25.51 | 3.75 | 0.11 | 92.0 |
| 8 | 51.00 | 21.00 | 24.26 | 3.75 | 0.18 | 92.9 |
| 9 | 51.00 | 23.50 | 21.76 | 3.75 | 0.21 | 92.0 |
| 10 | 51.00 | 24.75 | 20.51 | 3.75 | 0.13 | 88.7 |
| 11 | 51.00 | 26.00 | 19.26 | 3.75 | 0.09 | 87.7 |

TABLE 2

| Sample No. | Composition (Atom %) | | | | ZT | Relative Density (%) |
|---|---|---|---|---|---|---|
| | Fe | Ti | Si | Al | | |
| 12 | 51.00 | 23.50 | 25.50 | 0.00 | 0.01 | 90.9 |
| 13 | 51.00 | 23.50 | 24.97 | 0.54 | 0.02 | 92.6 |
| 14 | 51.00 | 23.50 | 24.43 | 1.07 | 0.04 | 89.4 |
| 15 | 51.00 | 23.50 | 23.90 | 1.61 | 0.11 | 93.0 |
| 16 | 51.00 | 23.50 | 23.36 | 2.14 | 0.13 | 89.2 |
| 17 | 51.00 | 23.50 | 22.83 | 2.68 | 0.15 | 90.5 |
| 18 | 51.00 | 23.50 | 22.29 | 3.21 | 0.18 | 90.6 |
| 19 | 51.00 | 23.50 | 21.76 | 3.75 | 0.21 | 92.0 |
| 20 | 51.00 | 23.50 | 19.62 | 5.89 | 0.20 | 88.3 |
| 21 | 51.00 | 23.50 | 17.48 | 8.03 | 0.19 | 93.1 |
| 22 | 51.00 | 23.50 | 14.80 | 10.70 | 0.08 | 87.6 |

REFERENCE SIGNS LIST 11 p-type thermoelectric conversion element
12 n-type thermoelectric conversion element
13a upper electrode
13b lower electrode
14a upper substrate
14b lower substrate
15 thermoelectric conversion element pair

The invention claimed is:

1. A p-type thermoelectric conversion material having a full Heusler alloy having a composition represented by the following General Formula (1) and having a relative density of 85% or more, $$Fe_xTi_yMA_aMB_b \qquad (1)$$

wherein in General Formula (1), MA is one element selected from the group consisting of Si, Sn, and Ge, MB is one element selected from the group consisting of Al, Ga, and In, and x, y, a, and b are numbers set so that x+y+a+b=100, a+b=z, 50<x≤52.5, 20≤y≤24.5, 24.5≤z≤29, a>0, and b>0 in atom %, respectively.

2. The p-type thermoelectric conversion material according to claim 1, wherein 20<y≤24.5 and a crystallization calorific value is 160 J/g or more.

3. The p-type thermoelectric conversion material according to claim 1, wherein in the General Formula (1), 2.5≤b≤9.

4. The p-type thermoelectric conversion material according to claim 1, wherein in the General Formula (1), 16.5≤a≤23.

5. The p-type thermoelectric conversion material according to claim 1, wherein in the General Formula (1), MA is Si and MB is Al.

6. The p-type thermoelectric conversion material according to claim 1, wherein in the General Formula (1), x, y, z, and b are numbers set so that 50.75≤x≤52, 20.5≤y≤24.25, 24.75≤z≤28.5, and 3≤b≤8.5, respectively.

7. The p-type thermoelectric conversion material according to claim 1, wherein in the General Formula (1), x, y, z, and b are numbers set so that 51≤x≤51.5, 21≤y≤24, 25≤z≤28, and 3.5≤b≤8, respectively.

8. The p-type thermoelectric conversion material according to claim 1, wherein the full Heusler alloy has an L2$_1$-type crystal structure.

9. A thermoelectric conversion module comprising:
a plurality of thermoelectric conversion elements; and
an electrode which electrically connects the thermoelectric conversion elements to each other,
wherein the thermoelectric conversion elements include a p-type thermoelectric conversion element including a p-type thermoelectric conversion material having a full Heusler alloy having a composition represented by the following General Formula (1) and having a relative density of 85% or more and an n-type thermoelectric conversion element connected to the p-type thermoelectric conversion element by the electrode, $$Fe_xTi_yMA_aMB_b \qquad (1)$$

in Formula (1), MA is one element selected from the group consisting of Si, Sn, and Ge, MB is one element selected from the group consisting of Al, Ga, and In, and x, y, a, and b are numbers set so that x+y+a+b=100, a+b=z, 50<x≤52.5, 20≤y≤24.5, 24.5≤z≤29, a>0, and b>0 in atom %, respectively.

10. The thermoelectric conversion module according to claim 9, wherein a thermoelectric conversion element including an n-type thermoelectric conversion material having an Fe$_2$TiSi-based full Heusler alloy is used as the n-type thermoelectric conversion element.

11. The thermoelectric conversion module according to claim 9, wherein a plurality of thermoelectric conversion element pairs each including the p-type thermoelectric conversion element, the n-type thermoelectric conversion element, and the electrode connecting the p-type thermoelectric conversion element and the n-type thermoelectric conversion element to each other are arranged.

12. A method of manufacturing a p-type thermoelectric conversion material, comprising:
preparing Fe raw material powders, Ti raw material powders, MA raw material powders, and MB raw material powders in a ratio depending on a target composition;
mixing the Fe raw material powders, the Ti raw material powders, the MA raw material powders, and the MB raw material powders with one another to prepare a mixture containing Fe, Ti, MA, and MB, and amorphizing the mixture to form an amorphized alloy; and
heating the amorphized alloy to manufacture the p-type thermoelectric conversion material having a full Heusler alloy having a composition represented by the following General Formula (1) and having a relative density of 85% or more, $$Fe_xTi_yMA_aMB_b \qquad (1)$$

wherein in Formula (1), MA is one element selected from the group consisting of Si, Sn, and Ge, MB is one element selected from the group consisting of Al, Ga, and In, and x, y, a, and b are numbers set so that x+y+a+b=100, a+b=z, 50<x≤52.5, 20≤y≤24.5, 24.5≤z≤29, a>0, and b>0 in atom %, respectively.

13. The method of manufacturing a p-type thermoelectric conversion material according to claim 12, wherein the amorphized alloy is heated at a temperature of 450° C. or more and 800° C. or less.

14. The method of manufacturing a p-type thermoelectric conversion material according to claim 12, wherein the amorphizing of the mixture is performed by a mechanical alloying method.

* * * * *